United States Patent [19]

Yokoyama et al.

[11] Patent Number: 4,769,570

[45] Date of Patent: Sep. 6, 1988

[54] PIEZO-ELECTRIC DEVICE

[75] Inventors: Katsunori Yokoyama, Ebina; Yukio Sato; Shunzo Shimai, both of Togane, all of Japan

[73] Assignee: Toshiba Ceramics Co., Ltd., Tokyo, Japan

[21] Appl. No.: 32,309

[22] Filed: Mar. 31, 1987

[30] Foreign Application Priority Data

Apr. 7, 1986 [JP] Japan .................................. 61-78289
Jul. 10, 1986 [JP] Japan ................................. 61-160842
Oct. 24, 1986 [JP] Japan ................................. 61-251850

[51] Int. Cl.$^4$ ............................................. H01L 41/08
[52] U.S. Cl. ....................................................... 310/332
[58] Field of Search .................................. 310/330–332

[56] References Cited

U.S. PATENT DOCUMENTS

| | | | |
|---|---|---|---|
| 2,479,926 | 8/1949 | Gravley | 310/332 |
| 2,633,543 | 3/1953 | Howatt | 310/332 |
| 3,084,228 | 4/1963 | Shiga | 310/332 X |
| 3,163,783 | 12/1964 | Howatt et al. | 310/332 X |
| 3,447,217 | 6/1969 | Kumada | 310/332 X |
| 4,349,762 | 9/1982 | Kitamura et al. | 310/332 |
| 4,443,729 | 4/1984 | Rider | 310/332 X |
| 4,610,426 | 9/1986 | Brandner | 310/332 X |
| 4,649,313 | 3/1987 | Ogawa et al. | 310/332 X |

FOREIGN PATENT DOCUMENTS 970817  7/1975  Canada ............................. 310/332

*Primary Examiner*—Mark O. Budd
*Attorney, Agent, or Firm*—Ronald P. Kananen

[57] ABSTRACT

A piezo-electric device such as a piezo bimorph device includes an intermediate plate, a plate-shaped first piezo ceramic element fixed on one surfaces of the intermediate plate, a plate-shaped second piezo ceramic element fixed on the other surface of the intermediate plate, and a lead wire for connecting the first piezo ceramic element with the second piezo ceramic element. The intermediate plate is made of a hardened tool steel containing carbon from 0.6 to 1.5%, or a fine ceramic material.

9 Claims, 8 Drawing Sheets

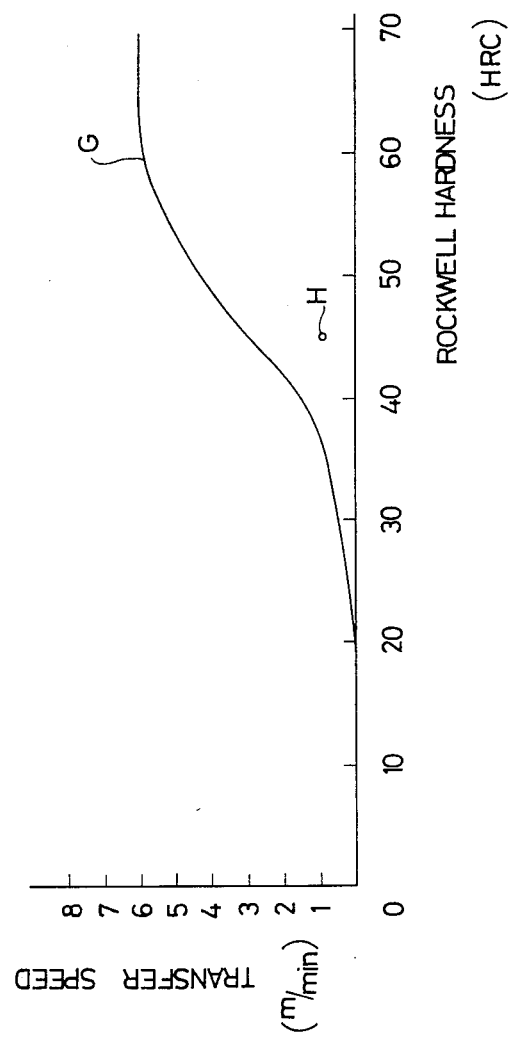

PIEZO-ELECTRIC DEVICE

BACKGROUND OF THE INVENTION

This invention relates to a piezo-electric device such as a piezo bimorph device or a piezo unimorph device functioning as a vibration source in a parts feeder.

A conventional piezo bimorph device includes an intermediate plate and two piezo ceramic elements fixed to both opposite surfaces of the intermediate plate in a sandwich manner. When a voltage is applied to the piezo ceramic elements, the piezo bimorph device bends or vibrates. Thus, the piezo bimorph device is used as a vibration source.

In the past, such a conventional intermediate plate is made of brass, phosphor bronze, stainless steel or spring steel.

The piezo bimorph device including such a conventional intermediate plate has such defects that, if it is used as a vibration source for a parts feeder, the transfer speed is largely affected by the weight of the parts to be transferred and a high voltage must be applied to the piezo bimorph device in order to obtain a desired transfer speed of 5 m/min or more.

SUMMARY OF THE INVENTION

An object of this invention is to provide a piezo-electric device such as a piezo bimorph device or a piezo unimorph device in which, if it is used as a vibration source in a parts feeder, the transfer speed is affected by the weight of the transferred parts only to a minor degree.

A further object of this invention is to provide a piezo-electric device for use in a parts feeder wherein a desired transfer speed can be easily obtained.

In a preferred first mode of this invention, a piezo-electric device such as a piezo bimorph device or a piezo unimorph device includes an intermediate plate, a plate-shaped first piezo ceramic element fixed on one surface of the intermediate plate, a plate-shaped second piezo ceramic element fixed on the other surface of the intermediate plate, a lead wire for connecting the first piezo ceramic element with the second piezo ceramic element. The intermediate plate and, the first piezo ceramic element and the second piezo ceramic element are arranged in a sandwich manner. The intermediate plate is made of a hardened tool steel containing carbon 0.6–1.5%. It is preferable that the tool steel consists of C 0.80–0.90%, Si 0.35% or less, Mn 0.50% or less, P 0.03% or less, and S 0.03% or less. Also, the steel preferably has a Rockwell hardness of HRC 40 or more and for the best results HRC 50 or more.

According to the first mode of this invention, the transfer performance can be remarkably improved if it is used as a vibration source for a parts feeder. If a constant voltage is applied to a piezo-electric device, the transfer speed is not significantly affected by the weight of articles to be transferred. Thus, energization of a parts feeder can be easily obtained. Also, it is easy to control precisely the transfer speed. As a result, it becomes possible to eliminate a feed-back sensor for controlling the transfer speed. Assuming that the transfer speed is at least 5 m/min, an applied voltage can be decreased thereby saving power consumption. Also, a power source can be compact in size saving the arrangement space.

In a preferred second mode of this invention, a piezo-electric device such as a piezo bimorph device or a piezo unimorph device includes an intermediate plate, a plate-like first piezo ceramic element fixed on one surface of the intermediate plate, a plate-like second piezo ceramic element fixed on the other surface of the intermediate plate, and a lead wire for connecting the first piezo ceramic element with the second piezo ceramic element. The intermediate plate, the first piezo ceramic element and the second piezo ceramic element are arranged in a sandwich manner. The intermediate plate is made of a fine ceramic material. Preferably, the fine ceramic material has an apparent porosity of 5% or less. Samples of the fine ceramic material are a simple oxide ceramic material, a composite oxide ceramic material, or non-oxide ceramic material.

According to the second mode of this invention, the transfer performance can be remarkably improved if it is used as a vibration source for a parts feeder. If a constant voltage is applied to a piezo-electric device, the transfer speed is not significantly affected by the weight of articles to be transferred. Thus, energization of a parts feeder can be easily obtained. Also, it is easy to control precisely the transfer speed. As a result, it becomes possible to eliminate a feed-back sensor for controlling the transfer speed. Assuming that the transfer speed is at least 5 m/min, an applied voltage can be decreased thereby saving the power consumption. Also, a power source can be compact in size saving the arrangement space.

In a preferred third mode of this invention, a piezo-electric device such as a piezo bimorph device or a piezo unimorph device includes an intermediate plate, a plate-like first piezo ceramic element fixed on one surface of the intermediate plate, a plate-like second piezo ceramic element fixed on the other surface of the intermediate plate, and a lead wire for connecting the first piezo ceramic element with the second piezo ceramic element. Although one of the first and second piezo ceramic elements can be omitted, the first and second piezo ceramic elements each consists of plural segments, for example, two halves which are separated from each other along a center line of the intermediate plate in its longitudinal direction. All segments are preferably rectangular. Two corners of the piezo ceramic elements can be cut in a triangular shape. A ratio (l/w) of the length (l) of the halves of the first and second piezo ceramic elements to the width (w) thereof is preferably 1.5 or more. A ratio (lo/wo) of the total length (lo) of the halves of the first and second piezo ceramic elements to the total width (wo) thereof is preferably 1.7 or less. If the piezo ceramic elements are formed so as to have such a shape, then they become similar to a square. The intermediate plate may be made of a hardened tool steel which contains carbon 0.6–1.5% and preferably consists of C 0.80–0.90%, Si 0.35% or less, Mn 0.50% or less, P 0.03% or less, and S 0.03% or less, and preferably has a Rockwell hardness of HRC 40 or more. Also, the intermediate plate may be made of a fine ceramic material having an apparent porosity of 5% or less.

According to the third mode of this invention, the vibration power can be increased. When a voltage is applied to a piezo-electric device, the segments or halves of the piezo ceramic elements are deformed so as to contract if the polarization direction and the electric field direction are the same while the elements are deformed so as to extend if the polarization and field directions are opposite. At that time, they are deformed in both length and width directions in the same manner.

However, as the piezo ceramic element is divided so as to consist of plural segments which are separated from each other preferably along a center line of the intermediate plate, the piezo-electric device is normally deformed only in its length direction but not deformed greatly in its width direction. Therefore, it is easy to increase the width of the piezo-electric device. For example, a square shape of piezo electric device can be obtained.

BRIEF DESCRIPTION OF THE DRAWINGS

FIG. 6 is a graph showing a relationship between hardness of an intermediate plate used in a piezo-electric device according to this invention and transfer speed thereof;

PREFERRED EMBODIMENTS OF THE INVENTION

Figure 1:
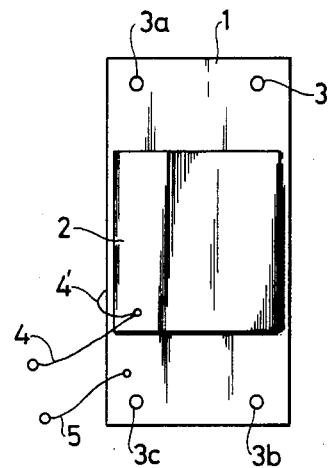
FIG. 1 is a front view showing a piezo bimorph device according to a preferred embodiment of this invention.
Figure 2:
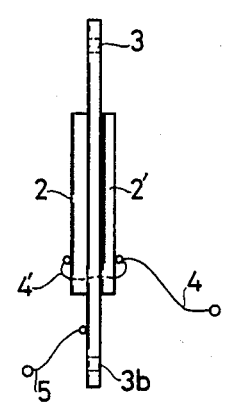
FIG. 2 is a side view showing the piezo bimorph device of FIG. 1.

FIGS. 1 and 2 show a preferred embodiment of this invention. A piezo bimorph device includes an intermediate plate 1 and a pair of piezo ceramic elements 2, 2'. The intermediate plate 1 is made of a tool steel containing carbon such as a SK steel defined in JIS G 4401 and SK 5 for the best results. The tool steel is hardened by a quenching method. The intermediate plate 1 preferably has a Rockwell hardness of HRC 40 or more. For the best results the Rockwell hardness of the intermediate plate 1 is HRC 50 or more.

The intermediate plate 1 has at its four corners threaded holes 3, 3a, 3b, 3c.

Figure 3:
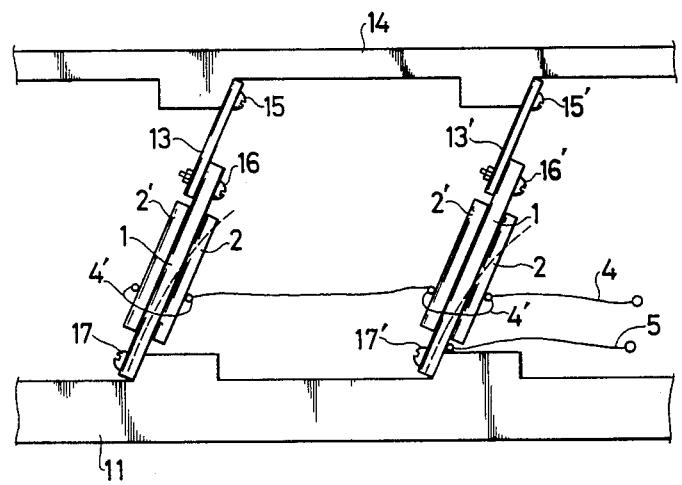
FIG. 3 is a schematic view showing a piezo type parts feeder equipped with a piezo bimorph device according to this invention.

FIG. 3 shows a schematic view of a piezo-type parts feeder in which the piezo bimorph device is used as a vibration source. Screws 17, 17' are screwed with the threaded holes 3b, 3c of the intermediate plate 1 so that one end of the intermediate plate 1 is fixed to a base 11. Other screws 16, 16' are screwed with the threaded holes 3, 3a of the intermediate plate 1 so that the other end of the intermediate plate 1 is fixed to one end of an enlarged bending spring 13, 13'. The other end of the enlarged bending spring 13, 13' is fixed to a trough 14 by means of secrews 15, 15'.

The piezo ceramic elements 2, 2' are fixed to both opposite surfaces of the intermediate plate 1, respectively, so as to be positioned within a central portion of the intermediate plate 1.

Silver electrodes are placed on both opposite surfaces of the piezo ceramic elements 2, 2' by a seizuring method or the like. The silver electrodes are polarized in the same polarization direction. After the piezo ceramic elements 2, 2' are fixed to the intermediate plate 1, an outer electrode is connected to a lead wire 4'. If a desired AC voltage is applied between a lead wire 4 joined to the lead wire 4' and a lead wire 5 joined to the intermediate plate 1, the piezo bimorph device bends or vibrates.

For example, the piezo ceramic elements are made of $PbTiO_3$-$PbZrO_3$-$Pb(Y.Nb)\frac{1}{2}O_3$ having a dielectric constant of 2,000 and a coupling factor of $K_{31}$ (35%). The intermediate plate can have a width of 25 mm, a length of 43 mm and a thickness of 1.5 mm. Each piezo ceramic element can have a width of 23 mm, a length of 30 mm and a thickenss of 2.5 mm. The enlarged bending springs 13, 13' are preferably made of a spring steel. In a preferred mode of this invention, four piezo bimorph devices as above-stated are placed as a vibration source of a feeder for ball-like parts having a diameter of 190 mm, at each 90 degrees.

Figure 4:
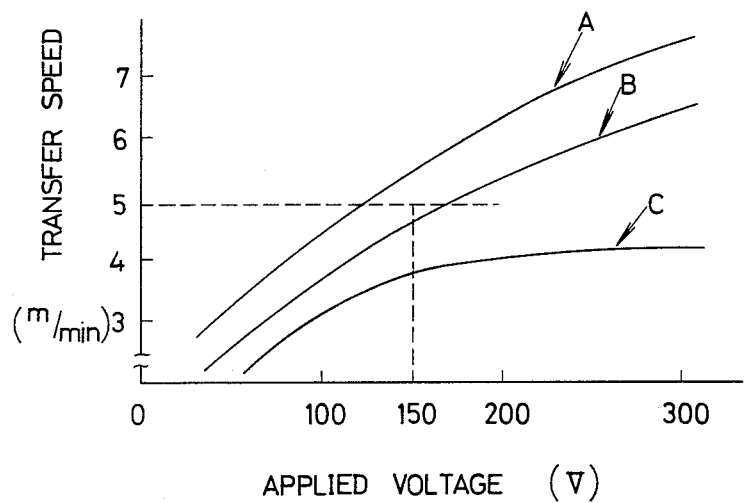
FIG. 4 is a graph showing a relationship between applied voltage and transfer speed.
Figure 5:
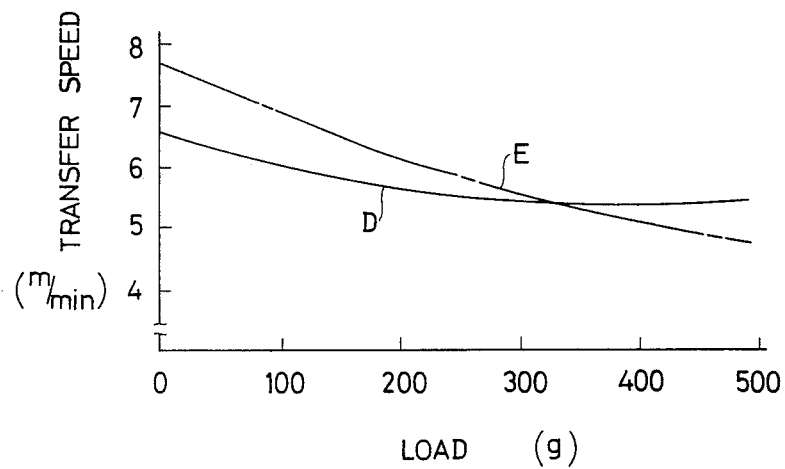
FIG. 5 is a graph showing a relationship between load of parts to be transferred and transfer speed.

FIGS. 4 and 5 show the characteristics of the piezo bimorph device. In FIG. 4, the horizontal axis shows the applied voltage V, and the vertical axis shows the transfer speed m/min. In this instance, the load of articles to be transferred is 300 g. The weight of the trough 14 is 700 g. The lines A and B show the characteristics of the piezo bimorph devices according to this invention. The piezo bimorph device characterized by the line A includes the intermediate plate 1 made of a tool steel of SK steel containing carbon which is hardened by a quenching method so as to have a Rockwell hardness of HRC 65. The piezo bimorph device characterized by the line B includes the intermediate plate 1 made of a tool steel or SK steel containing carbon which is hardened so as to have a Rockwell hardness of HRC 45.

The line C shows the characteristics of a piezo bimorph device as a comparative example outside the scope of this invention, which includes the intermediate plate 1 made of a steel such as SUS 304 in JIS and has a Rockwell hardness of HRC 20. The piezo bimorph device characterized by the line C has the same sizes as those of the piezo bimorph devices characterized by the lines A and B.

According to the piezo bimorph device of the line C, the transfer speed is low even if the applied voltage is increased.

As can be seen from FIG. 4, the transfer speed largely depends on the hardness of the intermediate plate 1. As the hardness of the intermediate plate 1 is increased, the transfer speed is also increased. If the piezo bimorph devices of the lines A and B are used, the transfer speed can be easily increased.

Referring to FIG. 4, as shown by the dotted lines, if the Rockwell hardness of the intermediate plate 1 is about HRC 50 or more, a transfer speed of 5 m/min or more can be easily obtained at an applied voltage of 150 V.

FIG. 5 shows a relationship between the load of the articles to be transferred and the transfer speed. The horizontal axis shows load (g), and the vertical axis shows transfer speed (m/min). Assuming that the voltage applied to the piezo bimorph device is 150 V(rms), as the load of the transferred articles changes, the transfer speed changes.

In FIG. 5, the line D shows the characteristics of the piezo bimorph device including the intermediate plate 1 made of a tool steel or SK steel containing carbon which is hardened so as to have a Rockwell hardness of HRC 65. The line D corresponds to the line A of FIG. 4. The line E shows the characteristics of the piezo bimorph device including the intermediate plate 1 made of a tool steel or SK steel containing carbon which is hardened so as to have a Rockwell hardness of HRC 45. The line E corresponds to the line B of FIG. 4.

As can be seen from FIG. 5, in case of the line E, the transfer speed changes only within a small range even if the load greatly changes. In case of the line D, the transfer speed changes only within a very limited range even if the load changes within a wide range.

In order that the transfer speed is 5 m/min or more, the voltage applied to the piezo bimorph device is set to be about 150 V (rms), and the actuation frequency is 180 Hz.

In FIG. 6, the horizontal axis shows a Rockwell hardness of the intermediate plate 1, and the vertical axis shows the transfer speed m/min. The applied voltage is 200 V (rms). The load of the transferred articles is 500 g, and the weight of the trough 14 is 1,500 g.

The line G shows the characteristics of the piezo bimorph device according to this invention. As the hardness increases, the transfer speed increases. The hardness is preferably HRC 40 or more. For best results, the hardness is HRC 50 or more.

In FIG. 6, the point H shows the characteristics of a comparative example outside the scope of this invention, which includes an intermediate plate made of a hardened spring steel having a Rockwell hardness of HRC 45.

In case of the line G, when the hardness is HRC 45, the transfer speed is about 3 m/min. However, at the point H, when the hardness is HRC 45, the transfer speed is about 1 m/min, which is very low.

Figure 8:
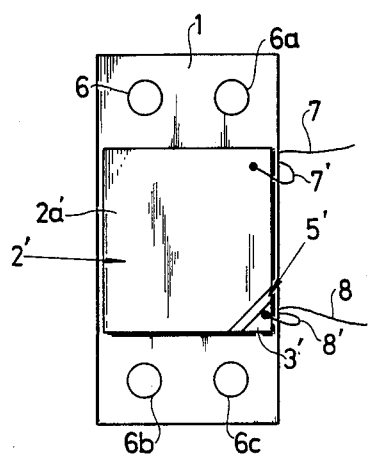
FIG. 8 is a rear view showing the piezo bimorph device of FIG. 7.
Figure 7:
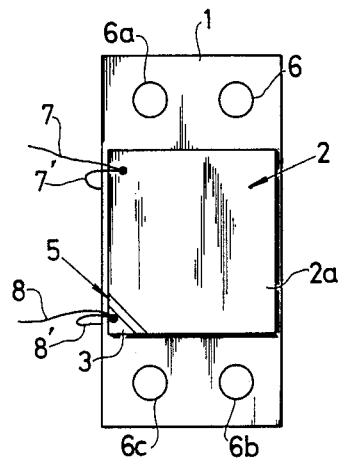
FIG. 7 is a front view showing a piezo bimorph device according to a further embodiment of this invention.
Figure 9:
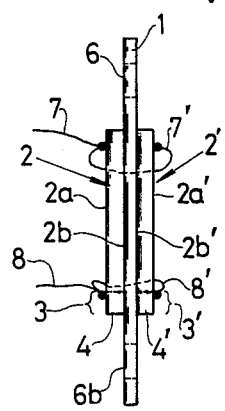
FIG. 9 is a side view showing the piezo bimorph device of FIG. 7.

FIGS. 7 to 9 show a further embodiment of this invention. A piezo bimorph device includes an intermediate plate 1 made of a fine ceramic material. The piezo bimorph device is suitable for use in a parts feeder as an oscillation source.

It is preferable that the fine ceramic material has an apparent porosity of 5% or less. Examples of the fine ceramic material are simple oxide ceramics, composite oxide ceramics and non-oxide ceramics. Examples of the simple oxide ceramics are alumina and zirconia. Examples of the composite oxide ceramics are mullite and spinel. Examples of non-oxide ceramics are silicon carbide and silicon nitride.

The intermediate plate 1 has four threaded holes 6, 6a, 6b, 6c at four corners of the intermediate plate 1.

Figure 10:
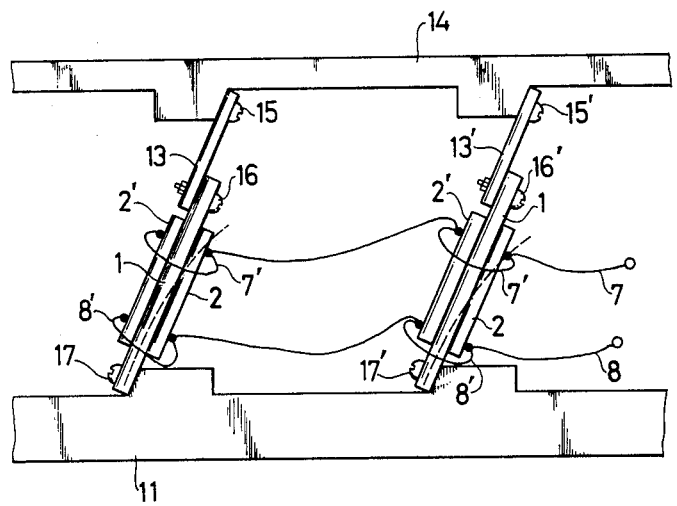
FIG. 10 is a schematic view showing a piezo-type parts feeder equipped with a piezo bimorph device according to this invention.

FIG. 10 schematically shows a piezo-type parts feeder. Screws 17, 17' are engaged with the threaded holes 6b, 6c of the intermediate plate 1 so that one end of the intermediate plate 1 is fixed to a base 11. Screws 16, 16' are engaged with the threaded holes 6, 6a of the intermediate plate 1 whereby the other end of the intermediate plate 1 is fixed to one end of the enlarged bending springs 13, 13'. The other end of the enlarged bending springs 13, 13' is fixed to a trough 14 by means of screws 15, 15'.

Two piezo ceramic elements 2, 2' are fixed to both opposite surfaces of the intermediate plate 1 by means of an organic adhesive. The piezo ceramic elements 2, 2' are polarized in the same polarization direction.

Silver electrodes $2b$, $2b'$ are placed on one surface of the piezo ceramic elements 2, 2', for example, by means of a seizuring method. The silver electrodes $2b$, $2b'$ are joined through the silver electrodes 4, 4' to the silver electrodes 3, 3', respectively. Therefore, the silver electrodes $2b$ and 3, $2b'$ and $3'$ have the same electric potential.

Silver electrodes $2a$, $2a'$ are placed on the other surface of the piezo ceramic elements 2, 2', for example, by means of a seizuring method. The silver electrodes $2a$ and 3 are not connected to each other because non-electrode portions 5, 5' are provided.

After the piezo ceramic elements 2, 2' are adhered to the intermediate plate 1, the outer silver electrodes $2a$, $2a'$ are connected through the lead wire 7' to each other, while the inner silver electrodes $2b$, $2b'$ are connected through the lead wire 8' to each other. If an AC voltage is applied between the lead wires 7 and 8 connected to the lead wires 7' and 8', the piezo bimorph device bends or vibrates.

The piezo ceramic elements can be made of $PbTiO_3$-$PbZrO_3$-$Pb(Y.Nb)\frac{1}{3}O_3$ having a dielectric constant of 2,000 and a coupling factor of $K_{31}$ (35%). The intermediate plate 1 may have a width of 25 mm, a length of 43 mm and a thickness of 1.5 mm. The piezo ceramic elements may have a width of 23 mm, a length of 30 mm and a thickness of 2.5 mm. The enlarged bending springs 13, 13' may be made of spring steel.

Figure 11:
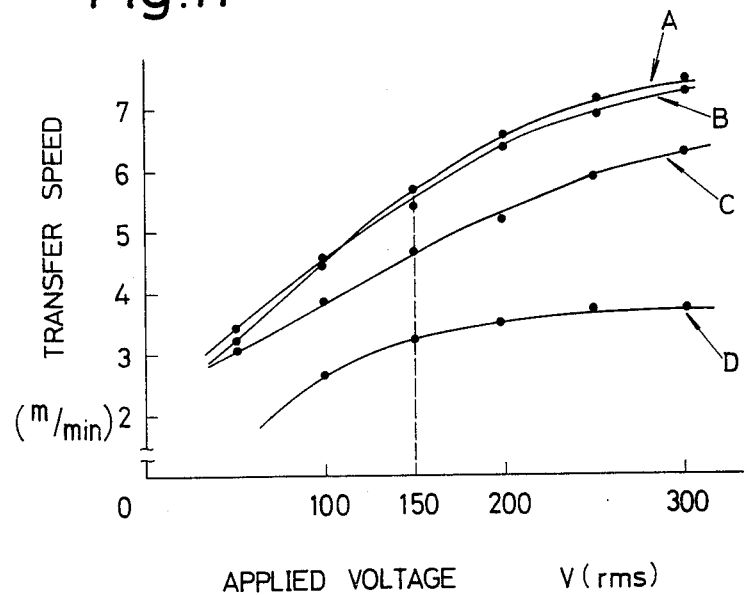
FIG. 11 is a graph showing a relationship between the applied voltage and transfer speed.
Figure 12:
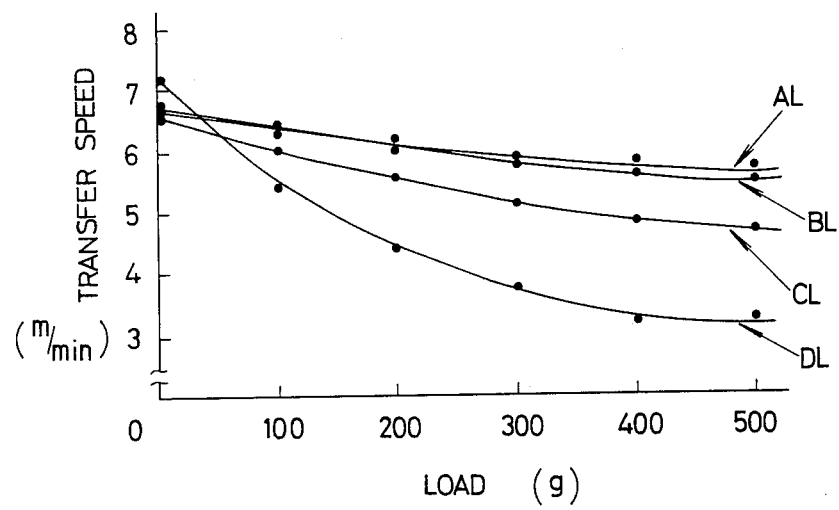
FIG. 12 is a graph showing a relationship between load of parts to be transferred and transfer speed thereof.

FIGS. 11 and 12 show the characteristics of the piezo bimorph device. Four piezo bimorph devices (not shown) are placed as a vibration source of a feeder for a ball-like parts having a diameter of 190 mm, at each 90 degrees.

In FIG. 11, the horizontal axis shows the applied voltage V (rms), and the vertical axis shows the transfer speed m/min. In this case, the load of the transferred articles is 500 g, and the weight of the trough is 700 g.

In FIG. 11, the lines A, B and C show the characteristics of the piezo bimorph devices according to this invention. The line D shows the characteristics of a piezo bimorph device as a comparative example outside the scope of this invention.

In the piezo bimorph device characterized by the line A, the intermediate plate 1 is made of alumina ceramics having a purity of 95% or more, a Vickers' hardness of HV 1,600 kg/mm$^2$ and an apparent porosity of 5% or less.

In the piezo bimorph device characterized by the line B, the intermediate plate 1 is made of silicon nitride ceramics having a purity of 85% or more, a Vickers' hardness of HV 1,600 kg/mm$^2$ and an apparent porosity of 1% or less.

In the piezo bimorph device characterized by the line C, the intermediate plate 1 is made of alumina ceramics having a purity of 95% or more, a Vickers' hardness of HV 1,600 kg/mm$^2$ and an apparent porosity of 8% or less.

In the piezo-bimorph device characterized by the line D, the intermediate plate 1 is made of a steel such as SUS 304 having a Vickers' hardness of 240 kg/mm$^2$. This piezo bimorph device has substantially the same sizes as those of the piezo-ceramic devices of the lines A, B and C. In case of the line D, the transfer speed is low even if the applied voltage is high.

In FIG. 11, if the applied voltage is more than 150 V, the transfer speed can become about 5 m/min or more only in case of the piezo bimorph devices of the lines A and B. In the piezo bimorph device of the line C, the transfer speed is slightly less than 5 m/min.

As can be seen from FIG. 11, the transfer speed largely depends on the material of the intermediate plate 1. If the lines A, B and C of this invention are compared with the line D of the comparative example, the transfer performance of the piezo-electric device in which the intermediate plate is made of a fine ceramic material can be remarkably improved so as to obtain energization and the improved power transfer efficiency of the piezo-electric device. In particular, if the apparent porosity of the fine ceramic material is 5% or less, the transfer performance can be remarkably improved. Even if the apparent porosity of the fine ceramic material is 10% or less, the transfer performance can be improved.

FIG. 12 shows the relationship between the load of the articles to be transferred and the transfer speed. The horizontal axis shows the load (g), and the vertical axis shows the transfer speed (m/min). If the voltage applied to the piezo bimorph device is 150 V (rms), the transfer speed changes as the load of the transferred articles changes.

According to the piezo bimorph device characterized by the line AL according to this invention, the intermediate plate is made of alumina ceramics having a purity of 95% or more, a Vickers' hardness of HV 1600 kg/mm$^2$ and an apparent porosity of 5% or less. This piezo bimorph device corresponds to the piezo bimorph device of the line A of FIG. 11.

In the piezo bimorph device characterized by the line BL according to this invention, the intermediate plate is made of silicon nitride ceramics having a purity of 85% or more, a Vickers' HV 1600 kg/mm$^2$ and an apparent porosity of 1% or less. This corresponds to the piezo bimorph device of the line B in FIG. 11.

In the piezo bimorph device characterized by the line CL (FIG. 12) according to this invention, the intermediate plate is made of alumina ceramics having a purity of 95% or more, a Vickers' hardness of HV 1600 kg/mm$^2$ and an apparent porosity of 8%. This corresponds to the piezo bimorph device of the line C in FIG. 11.

In the comparative example characterized by the line DE (FIG. 12), an intermediate plate is made of a steel such as SUS 304 having a Vickers' hardness of HV 240 kg/mm$^2$. This corresponds to the piezo bimorph device of the line D of FIG. 11.

As can be seen from FIG. 12, the lines AL, BL and CL of this invention show that the transfer speed is not greatly affected by the load of the articles as compared with the line DL of the comparative example. This means that the performance of the piezo bimorph device can be improved if the intermediate plate is made of a fine ceramic material. In particular, if the fine ceramic material has an apparent porosity of 5% or less, the transfer speed changes only within a very limited range.

As can be seen from FIGS. 11 and 12, in order that the transfer speed is 5 m/min or more, the voltage applied to the piezo bimorph device can be set to be about 150 V (rms), and the actuation frequency is 180 Hz.

Figure 13:
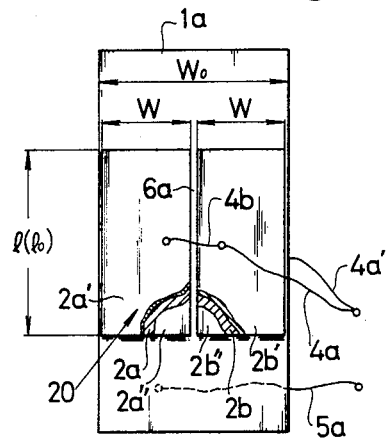
FIG. 13 is a front view showing a piezo bimorph device according to another embodiment of this invention.
Figure 14:
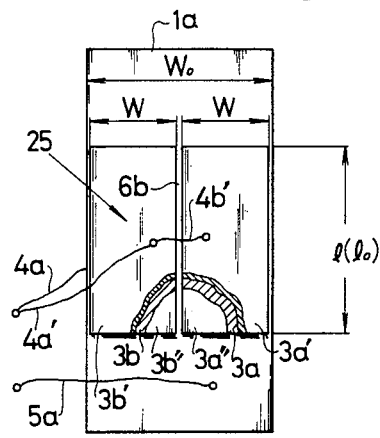
FIG. 14 is a rear view showing a further piezo bimorph device.
Figure 15:
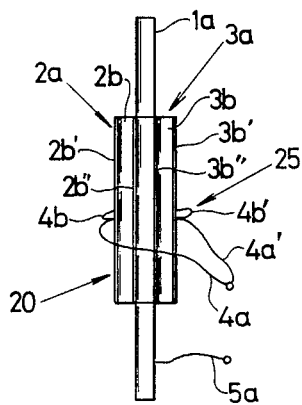
FIG. 15 is a side view showing the piezo bimorph device of FIG. 14.

FIGS. 13 to 15 show another embodiment of this invention. The piezo bimorph device includes an intermediate plate 1a and a pair of piezo ceramic elements 20, 25 fixed to the opposite surfaces of the intermediate plate 1a. The piezo ceramic elements 20, 25 each consists of plural segments such as two halves 2a, 2b, 3a, 3b which are separated along a center line of the intermediate plate 1a in its longitudinal direction. These halves 2a, 2b are fixed to one surface of the intermediate plate 1a by means of an epoxy adhexive. The halves 3a, 3b are fixed to the other surface of the intermediate plate 1a by means of an epoxy adhesive. A clearance 6a is formed between the halves 2a, 2b. Also, a clearance 6b is formed between the halves 3a, 3b.

The halves 2a, 2b, 3a, 3b have substantially the same rectangular shape. The ratio (l/w) of the length (l) to the width (w) of each halves 2a, 2b, 3a, 3b is set to be 1.5 or more. The ration (lo/wo) of the total length (lo) to the total width (wo) of the piezo ceramic elements 20 is set to be 1.7 or less wherein the total length (lo) is the total length of the two halves 2a, 2b. The ratio (lo/wo) of the piezo ceramic element 25 is also set to be 1.7 or less.

Silver electrodes 2a', 2a" are provided on both opposite surfaces of the half 2a, for example, by means of a seizuring method. Also, electrodes 2b', 2b" are formed on both opposite surfaces of the half 2b. The electrodes 3a', 3a" are formed on both opposite surfaces of the half 3a. The electrodes 3b', 3b" are formed on both opposite surfaces of the half 3b.

The electrodes 2a', 3a' are connected to each other. Also, the electrodes 2b", 3b" are connected to each other. The electrodes 2a' and 2b' are connected through a lead wire 4b to each other. The electrodes 3a' and 3b' are connected through a lead wire 4b' to each other. An outer lead wire 4a is connected to the lead wire 4b. An outer lead wire 4a' is connected to the lead wire 4b'. The outer lead wires 4a' and 4b' are connected to each other. The electrodes 2a', 2b', 3a', 3b' have the same electric potential.

A lead wire 5a is connected to one end of the intermediate plate 1a. A DC voltage or AC voltage is applied between the lead wire 5a and the lead wire 4a, 4a' whereby the piezo bimorph device can vibrate or bend.

Figure 16:
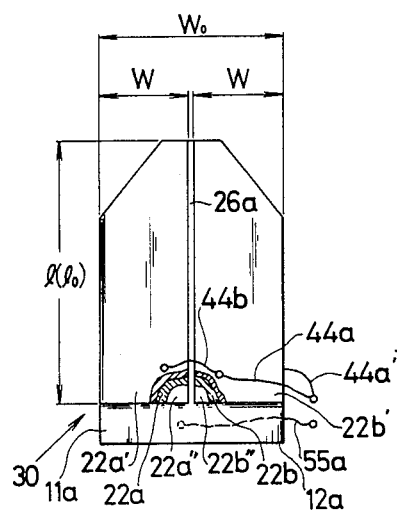
FIG. 16 is a front view showing a piezo bimorph device according to another embodiment of this invention.
Figure 17:
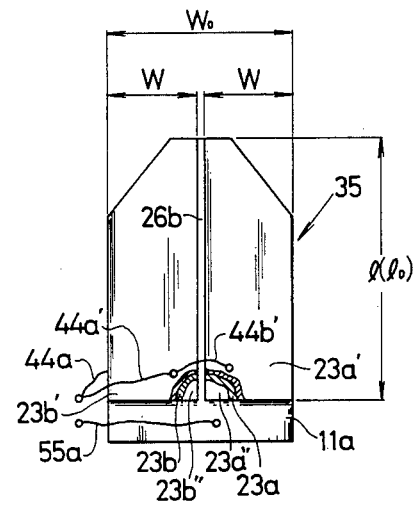
FIG. 17 is a rear view showing the piezo-bimorph device of FIG. 16.
Figure 18:
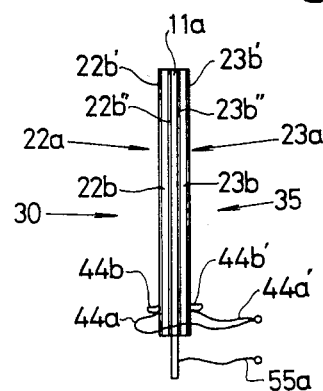
FIG. 18 is a side view showing the piezo bimorph device of FIG. 16.

FIGS. 16 to 18 show another embodiment of this invention wherein two corners of an intermediate plate 11a are cut. The piezo ceramic elements 30, 35 are joined to the intermediate plate 11a. Each of the piezo ceramic elements 30, 35 has two halves 22a, 22b which are separated along a center line of the intermediate plate 11a in its longitudinal direction. The two halves 22a, 22b are fixed to one surface of the intermediate plate 11a by means of an epoxy adhesive. Another pair of halves 23a, 23b are also fixed to the other surface of the intermediate plate 11a by means of an epoxy adhexive.

A clearance 26a is formed between the halves 22a and 22b. Another clearance 26b is formed between the halves 23a and 23b. The halves 22a, 22b, 23a, 23b are cut at a corner thereof so as to partly correspond in shape to the intermediate plate 11a.

In the embodiment shown in FIGS. 16 to 18, the ratio (l/w) of the halves 22a, 22b, 23a, 23b and the ratio (lo/wo) of the piezo ceramic elements 30, 35 have substantially the same value as those of the embodiment shown in FIGS. 13 to 15.

The electrodes 22a' and 22a" are formed on both opposite surfaces of the half 22a. The electrodes 22b' and 22b" are formed on both opposite surfaces of the half 22b. The electrodes 23a' and 23a" are formed on both opposite surfaces of the half 23a. The electrodes 23b' and 23b" are formed on both opposite surfaces of the half 23b. The electrodes 22b" and 23b" are connected to each other. The electrodes 22a" and 23a" are connected to each other. The electrodes 22a' and 22b' are connected through a lead wire 44b to each other. The electrodes 23a' and 23b' are connected through a lead wire 44b' to each other. The lead wire 44b' is connected to an outer lead wire 44a'. The outer lead wires 44a and 44a' are connected to each other. The electrodes 22a', 22b', 23a', 23b' have the same electric potential. A lead wire 55a is connected to an extension 12a of the intermediate plate 1a. A DC voltage or AC voltage is applied between the lead wire 55a and the lead wire 44a, 44a' whereby the piezo bimorph device can vibrate or bend.

Some test results of this invention will be explained in comparison with a comparative example.

The intermediate plate 1a according to the embodiment of FIGS. 13 to 15 has a width of 15 mm, a length of 32 mm, and a thickness of 1.5 mm. Each of the halves 2a, 2b, 3a, 3b has a width (w) of 7 mm, a length (l) of 15 mm and a thickness of 2 mm. Each of the halves is made of $PbTiO_3\text{-}PbZrO_3\text{-}Pb(Y_{\frac{1}{2}}Nb_{\frac{1}{2}})O_3$.

Four halves 2a, 2b, 3a, 3b are fixed to the intermediate plate 1a so as to have the same polarization direction. A comparative example outside the scope of this invention has substantially the same construction as those of the embodiment of FIGS. 13 to 15.

An AC voltage of 200 V with 100 Hz is applied between the lead wires 4a, 4a', 5a of the piezo bimorph device.

Figure 19:
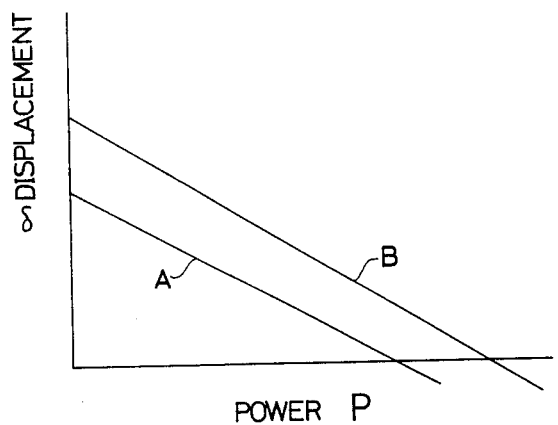
FIG. 19 is a graph showing the performance of the piezo bimorph device according to this invention in comparison with a convention piezo bimorph device.

FIG. 19 shows the relationship between the bending degree or displacement and the power of the piezo bimorph devices according to both this invention and the comparative example. The line A shows the characteristics of the comparative example. The line B shows the characteristics of the piezo bimorph device according to the embodiment of FIGS. 13 to 15. The piezo bimorph device according to this invention can be about 1.5 times in displacement and power as the comparative example.

Next, the embodiment of FIGS. 16 to 18 will be compared with another comparative example. The intermediate plate 11a of this invention has a width of 15 mm, a length of 25 mm and a thickness of 0.2 mm. Each of the halves 22a, 22b, 23a, 23b has a width (w) of 7 mm, a length (l) of 20 mm and a thickness of 0.3 mm. These halves are fixed to the intermediate plate 11a so as to have the same polarization direction.

The sample example has substantially the same shape and arrangement as those of the embodiment of FIGS. 16 to 18.

An AC voltage of 50 V with 100 Hz is applied in the same way as in the embodiment of FIGS. 13 through 15. The test results show that the piezo bimorph device according to this invention can be about 1.4 times in both displacement and power as the comparative example.

The Japanese patent applications Nos. 61-78289, 61-160842 and 61-251850 disclose details of the piezo electric devices and test methods, which are incorporated by reference.

A piezo electric device according to this invention can be also used as a vibration source for an ultrasonic machine or the like.

We claim:
1. A piezo-electric device comprising:
   an intermediate plate having opposite surfaces,
   a plate-shaped first piezo ceramic element fixed on one of the opposite surfaces of the intermediate plate,
   a plate-shaped second piezo ceramic element fixed on the other surface of the intermediate plate,
   the intermediate plate, the first piezo ceramic element and the second piezo ceramic element being arranged in a sandwich manner, and
   a lead wire for connecting the first piezo ceramic element with the second piezo ceramic element,
   the intermediate plate being made of a hardened tool steel containing carbon from 0.6% to 1.5%.
2. A piezo-electric device as defined in claim 1, wherein the steel consists of C from 0.80 to 0.90%, Si 0.35% or less, Mn 0.50% or less, P 0.03% or less, and S 0.03% or less.
3. A piezo-electric device as defined in claim 1, wherein the steel has a Rockwell hardness of HRC 40 or more.
4. A piezo-electric device as defined in claim 1, wherein the first and second piezo ceramic elements each consists of two halves which are separated from each other along a center line of the intermediate plate in its longitudinal direction.
5. A piezo-electric device as defined in claim 4, wherein a ratio (l/w) of the length (l) of the halves of the first and second piezo ceramic elements to the width (w) thereof is 1.5 or more.
6. A piezo-electric device as defined in claim 4, wherein a ratio (lo/wo) of the total length (lo) of the halves of the first and second piezo ceramic elements to the total width (wo) thereof is 1.7 or less.
7. A piezo-electric device as defined in claim 1, wherein the device is a piezo bimorph device.
8. A piezo-electric device as defined in claim 1, wherein at least one of the first and second piezo ceramic elements consists of plural separate segments each of which is rectangular in shape.
9. A piezo-electric device as defined in claim 1, wherein the device is a piezo unimorph device.

* * * * *